United States Patent
Gandini et al.

(10) Patent No.: US 6,270,938 B1
(45) Date of Patent: Aug. 7, 2001

(54) ACETAL COPOLYMERS AND USE THEREOF IN PHOTOSENSITIVE COMPOSITIONS

(75) Inventors: Alessandro Gandini, Saint Martin d'Uriage; Sandrine Waig Fang, Grenoble, both of (FR); Hans-Joachim Timpe; Harald Baumann, both of Osterode (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/590,930

(22) Filed: Jun. 9, 2000

(51) Int. Cl.[7] ............................... G03F 7/021; C08F 8/00
(52) U.S. Cl. .................. 430/157; 430/175; 430/176; 430/278.1; 430/302; 525/61; 101/459; 101/467
(58) Field of Search ................... 430/157, 175, 430/176, 278.1, 302; 525/61; 101/459, 467

(56) References Cited

U.S. PATENT DOCUMENTS

| | | | |
|---|---|---|---|
| 2,179,051 | 11/1939 | Morrison et al. | 260/73 |
| 2,714,066 | 7/1955 | Jewett et al. | 95/8 |
| 2,946,638 | 7/1960 | Colo | 312/255 |
| 3,732,105 | 5/1973 | Colo | 312/255 |
| 3,732,106 | 5/1973 | Steppan et al. | 96/115 |
| 4,123,276 | 10/1978 | Kita et al. | 96/91 |
| 4,304,832 | 12/1981 | Ohta et al. | 430/175 |
| 4,355,096 | 10/1982 | Walls | 430/302 |
| 4,387,151 | 6/1983 | Bosse et al. | 430/175 |
| 4,511,640 | 4/1985 | Liu | 430/157 |
| 4,618,562 | 10/1986 | Walls et al. | 430/157 |
| 4,631,245 | 12/1986 | Pawlowski | 430/175 |
| 4,665,124 | 5/1987 | Walls et al. | 525/61 |
| 4,687,727 | 8/1987 | Toyama et al. | 430/175 |
| 4,731,316 | 3/1988 | Tomiyasu et al. | 430/157 |
| 4,741,985 | 5/1988 | Aoai et al. | 430/175 |
| 4,774,161 | 9/1988 | Sekiya et al. | 430/175 |
| 4,840,868 | 6/1989 | Pawlowski et al. | 430/155 |
| 4,845,009 | 7/1989 | Kita et al. | 430/176 |
| 4,877,711 | 10/1989 | Aoai et al. | 430/176 |
| 4,940,646 | 7/1990 | Pawlowski | 430/175 |
| 4,950,582 | 8/1990 | Aoai et al. | 430/175 |
| 4,983,491 | 1/1991 | Aoai et al. | 430/175 |
| 5,112,743 | 5/1992 | Kamiya et al. | 430/175 |
| 5,143,813 | 9/1992 | Joerg | 430/162 |
| 5,169,897 | 12/1992 | Walls | 525/61 |
| 5,176,985 | 1/1993 | Seitz et al. | 430/284 |
| 5,187,040 | 2/1993 | Mueller-Hess et al. | 430/157 |
| 5,206,113 | 4/1993 | Mueller-Hess et al. | 430/270 |
| 5,219,699 | 6/1993 | Walls et al. | 430/156 |
| 5,238,772 | 8/1993 | Mueller-Hess et al. | 430/175 |
| 5,260,161 | 11/1993 | Matsumura et al. | 430/161 |
| 5,534,381 | * 7/1996 | Ali et al. | 430/156 |
| 5,925,491 | 7/1999 | Baumann et al. | 430/175 |

FOREIGN PATENT DOCUMENTS

| | | |
|---|---|---|
| 1172492 | 8/1984 | (CA) . |
| 104863 | 4/1984 | (EP) . |
| 208145 | 1/1987 | (EP) . |
| 368327 | 5/1990 | (EP) . |
| 397375 | 11/1990 | (EP) . |
| 487343 | 5/1992 | (EP) . |
| 679950 | 11/1995 | (EP) . |
| 996603 | 5/1998 | (EP) . |
| WO8901871 | 3/1989 | (WO) . |

OTHER PUBLICATIONS

H. Baumann and H. –J. Timpe, "Chemical Aspects of Offset Printing" in *J. prakt. Chem./Chemiker–Zeitung*, vol. 336, pp. 377–389 (1994).
Derwent WPI Abstract No. 000870558.
Derwent WPI Abstract No. 003480965.
Derwent WPI Abstract No. 003657746.
Derwent WPI Abstract No. 004248989.
Derwent WPI Abstract No. 004377077.
Derwent WPI Abstract No. 004667361.
Derwent WPI Abstract No. 007087880.
Derwent WPI Abstract No. 007095036.
Derwent WPI Abstract No. 007210304.
Derwent WPI Abstract No. 007542762.
Derwent WPI Abstract No. 007557343.
Derwent WPI Abstract No. 007820361.
Derwent WPI Abstract No. 008353455.
Derwent WPI Abstract No. 008503898.
Derwent WPI Abstract No. 008505540.
Derwent WPI Abstract No. 008555323.
Derwent WPI Abstract No. 008562863.

* cited by examiner

*Primary Examiner*—John S. Chu
(74) *Attorney, Agent, or Firm*—Baker Botts L.L.P.

(57) ABSTRACT

The present invention relates to particular acetal copolymers and radiation-sensitive compositions comprising said copolymers and, inter alia, are excellently suitable for the production of lithographic printing plates. In particular, the invention relates to acetal copolymers containing furylvinylidene, thienylvinylidene or pyrrolylvinylidene.

30 Claims, No Drawings

ACETAL COPOLYMERS AND USE THEREOF IN PHOTOSENSITIVE COMPOSITIONS

BACKGROUND OF THE INVENTION

1. Field of the Invention

The present invention relates to particular acetal copolymers and photosensitive compositions comprising said copolymers and, inter alia, are excellently suitable for the production of lithographic printing plates. In particular, the invention relates to acetal copolymers containing furylvinylidene, thienylvinylidene or pyrrolylvinylidene units.

2. Background Information

Nowadays, photosensitive compositions usable particularly for high-performance lithographic plates must fulfill high requirements.

In order to improve the properties of photosensitive compositions and thus also of the corresponding lithographic plates, essentially two different ways are taken. One of them deals with the improvement of the properties of the photosensitive components in the compositions (frequently negative diazo resins, photo polymers etc.), the other one with the search for novel polymeric compounds ("binders"), which are to control the physical properties of the photosensitive layers. In particular the latter way is decisive for lithographic plates because the behavior in the developing and printing processes (such as developability, ink receptivity, scratch resistance, consistency in the number of prints produced) is decisively influenced by the polymeric binders. Also shelf life and photosensitivity of the materials are strongly influenced by such polymeric compounds.

The polymeric binders, therefore, exhibit various structural elements for satisfying the extensive requirements, which may have different effects on individual properties. For instance, hydrophilic structural elements such as carboxyl groups, hydroxyl groups and the like generally promote the developability of the photosensitive compositions in aqueous alkaline developers and partly ensure sufficient adhesion to polar substrates. Hydrophobic structural elements, on the other hand, reduce the capability of being developed in the above-mentioned developers, but ensure the good ink receptivity used in the printing process, which is indispensable in lithographic plates.

Due to the broad range of requirements regarding the polymeric binders, there have been extensive studies for many years on the synthesis and optimization of the use of these substances for photosensitive compositions, cf e.g. H. Baumann and H.-J. Timpe: "Chemical Aspects of Offset Printing" in *J. prakt. Chem./Chemiker-Zeitung* [Journal for chemists] 336 (1994) pages 377–389.

EP-A-135 026, EP-A-186 156 and U.S. Pat. No. 4,731, 316 describe binder systems consisting of compositions of polymers having different hydrophilic/hydrophobic properties. However, such compositions have the disadvantage that very frequently incompatibilities between the different substances lead to separation during the formation of layers. Furthermore, it was found that the hydrophobic polymers precipitate during the developing process of the processing of the lithographic plates, which may lead to silting in the developing machines and the redeposition of dispersed layer portions on the surface of the photosensitive material.

Furthermore, various copolymers consisting of only slightly hydrophilic monomers such as styrene, acrylic acid ester, methacrylic acid ester and the like with hydrophilic comonomers were described. Examples of such comonomers are semi-esters of maleic acid (DE-A-31 30 987, EP-B-71 881, EP-A-104 863), itaconic acid (EP-A-397 375, U.S. Pat. No. 5,260,161) and acrylic acid and/or methacrylic acid (EP-A-487 343, U.S. Pat. No. 4,304,832, U.S. Pat. No. 4,123,276). The very tight play of the properties important for their use, which are layer adhesion, developability and printing ink receptivity, proved to be disadvantageous in such polymers. Variations in the polymers' composition can hardly be avoided during the production process, which leads to unacceptable fluctuations in the plates' properties.

DE-A-27 51 060 describes photosensitive compositions, wherein the binder is a reaction product of cellulose esters with cyclic, intermolecular acid anhydrides of dicarboxylic acids. These binders, however, are not oleophilic enough for the use in lithographic plate formulations.

Polymers that contain urethane groups were also described as binders for photosensitive compositions (EP-A-415 302, EP-A-406 599, EP-A-406 600, EP-A-414 099, U.S. Pat. No. 4,983,491, U.S. Pat. No. 4,950,582, U.S. Pat. No. 4,877,711). These polyurethane resins contain functional groups (—COOH, —SO$_2$NHCOO—, —CONHSO$_2$NH—) with an acidic hydrogen, whose pK$_a$ values in water are no higher than 7. The necessary functionalization with such hydrophilic groups, however, requires very high efforts regarding synthesis and involves high costs.

Another group of binders described are acetals of aliphatic aldehydes having a lower alkyl group and vinyl alcohol/vinyl acetate copolymers (U.S. Pat. No. 2,179,051, EP-B1-216 083). Such binders, however, cause problems in the developing of lithographic plates due to the portion of hydrophilic groups in the polymer being too low. Semi-acetalized vinyl alcohol/vinyl acetate copolymers were provided with alkali soluble groups by means of special reactions for improvement (EP-A-48 876, U.S. Pat. No. 4,387, 151, U.S. Pat. No. 3,732,106, DE-A-20 53 363, EP-A-152 819, DE-A-36 44 163, U.S. Pat. No. 4,741,985, EP-A-208 145, DE-A-37 01 626, U.S. Pat. No. 5,169,897, DE-A-36 44 162, U.S. Pat. No. 4,940,646, DE-A-39 03 001, U.S. Pat. No. 5,925,491 and U.S. Pat. No. 5,219,699). Particularly preferred, carboxyl and sulfonyl urethane groups were introduced into the polymers in order to achieve the desired developability parameters. The introduction of the acidic carboxyl group into the side chain of the polyvinyl acetals may, however, lead to ink receptivity problems, particularly when alkaline wetting agents are used in the printing process. In the case of sulfonyl urethane containing binders, this disadvantage is almost excluded; however, the production of such binders involves difficulties and high costs. Also in the case of polyvinyl acetals, which have stilbazole units within the molecule (U.S. Pat. No. 5,330,877), a good ink receptivity is practically not achieved.

In addition, all these known systems have the disadvantage of a relatively low photochemical sensitivity, which is why they are rather unsuitable for applications requiring highly sensitive compositions.

It is known that the light-induced cross-linking of imido-group containing polymers in the presence of certain sensitizers may lead to photosensitive compositions having a higher photochemical sensitivity. However, their use for producing lithographic plates is strongly limited due to an insufficient adhesion on the commonly used aluminum substrates. This particularly leads to a reduced number of prints produced, so that their practical use is complicated greatly. Therefore, especially prepared substrates are necessary (EP-A-377 589), or diazo resins (U.S. Pat. No. 5,112,743, DE-C-3 633 456, EP-A-368 327) and/or certain polymers (EP-A-679 950) must be added. The latter measures, however, lead to a lower sensitivity of such compositions, which in turn leads to longer exposure times.

EP-A-996 603 describes polyvinyl acetal binders having imido groups. Although photosensitive compositions comprising these binders show high photosensitivity, the print run stability of lithographic printing plates obtained therefrom is not sufficient. Furthermore, the photosensitive compositions still need a sensitizer in addition to the polyvinyl acetal which is a certain economical disadvantage.

SUMMARY OF THE INVENTION

It is thus the object of the present invention to provide polymers which, in addition to their high photosensitivity, ensure a good adhesion to Al substrates and thus lead to a high print run stability. It is furthermore the object of the present invention to provide polymers enabling compositions to suffice with as few components as possible vis-à-vis the compositions described in the state of the art when used in photosensitive compositions (which makes them economically desirable) and still having the same or—in individual areas—improved physical properties.

These objects are achieved by a polyvinyl acetal copolymer comprising units A, B, C, D, wherein A is present in an amount of about 0.5 to about 20 wt.-% and is of the formula

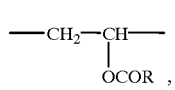

(A)

wherein R is hydrogen or $C_1$–$C_6$ alkyl,

B is present in an amount of about 10 to about 35 wt.-% and is of the formula

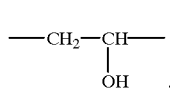

(B)

C is present in an amount of about 10 to about 55 wt.-% and is of the formula

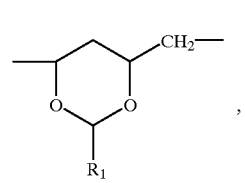

(C)

wherein $R^1$ is an alkyl group with up to 4 carbons, which is optionally substituted by an acid group, or a phenyl group to which an acid group is attached, wherein the phenyl group optionally comprises 1 to 2 further substituents selected from halogen atoms, amino, methoxy, ethoxy, methyl and ethyl groups, or is a group X—$NR^2$—CO—Y—COOH, wherein X is an aliphatic, aromatic or araliphatic spacer group, $R^2$ is hydrogen or an aliphatic, aromatic or araliphatic moiety and Y is a saturated or unsaturated chain- or ring-shaped spacer group, and this unit C may be contained several times in the copolymer with various moieties $R^1$ independent of one another, and D is present in an amount of about 5 to about 45 wt.-% and is of the formula

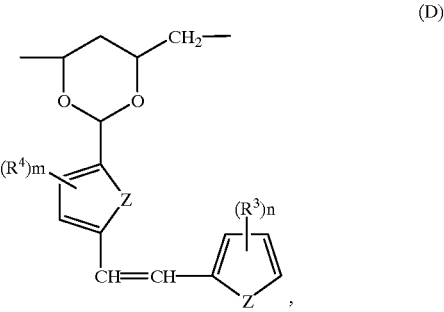

(D)

wherein each Z is independently selected from the group consisting of O, S and $NR^5$ with $R^5$ being selected from the group consisting of hydrogen, $C_1$–$C_4$ alkyl and phenyl, the phenyl being optionally substituted with one or two substituents selected from the group consisting of halogen, $C_1$–$C_4$ alkoxy and $C_1$–$C_4$ alkyl;

$R^3$ and $R^4$ are independently selected from $C_1$–$C_4$ alkyl and a phenyl group, the phenyl being optionally substituted with one or two substituents selected from the group consisting of halogen, $C_1$–$C_4$ alkoxy and $C_1$–$C_4$ alkyl; m is 0, 1 or 2 and n is 0, 1, 2 or 3, and this unit (D) may be contained several times in the copolymer with various moieties Z, $R^3$ and $R^4$ independent of one another.

DETAILED DESCRIPTION OF THE INVENTION

The polyvinyl acetal copolymer of the present invention comprises about 0.5 to about 20 wt.-% based on the total copolymer unit (A)

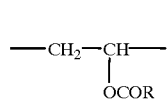

(A)

wherein R is hydrogen or $C_1$–$C_6$ alkyl.

Unit (A) is preferably present in the copolymer in an amount of about 5 to about 20 wt.-%, especially preferred about 10 to about 15 wt.-%.

R is preferably methyl. Unit A may be present several times in a polymer molecule with different groups R.

The copolymer further comprises about 10 to about 35 wt.-% of unit (B)

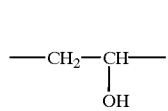

(B)

Preferably the amount of (B) is about 10 to about 20 wt.-%, more preferred about 10 to about 15 wt.-%.

Still a further essential unit of the polyvinyl acetal copolymer of the present invention is unit (C)

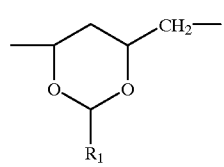
(C)

wherein $R^1$ is an alkyl group with up to 4 carbons, which is optionally substituted by an acid group, or a phenyl group to which an acid group is attached, wherein the phenyl group optionally comprises 1 to 2 further substituents selected from halogen atoms, amino, methoxy, ethoxy, methyl and ethyl groups, or is a group X—$NR^2$—CO—Y—COOH, wherein X is an aliphatic, aromatic or araliphatic spacer group, $R^2$ is hydrogen or an aliphatic, aromatic or araliphatic moiety and Y is a saturated or unsaturated chain- or ring-shaped spacer group, and this unit C may be contained several times in the copolymer with various moieties $R^1$ independent of one another.

Unit (C) is present in the copolymer in an amount of about 10 to about 55 wt.-%, preferably about 25 to about 45 wt.-%, more preferred about 30 to about 40 wt.-%.

X is preferably selected from —$CH_2$—, —$CH(CH_3)$— or —$CH_2CH_2CH_2$—.

Y is preferably selected from —$CR^6R^7$—$CR^8R^9$—, —$CR^6$=$CR^7$—

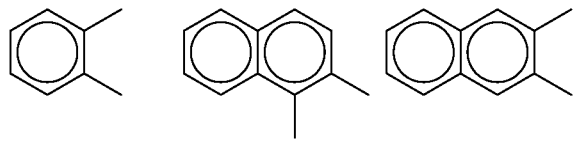

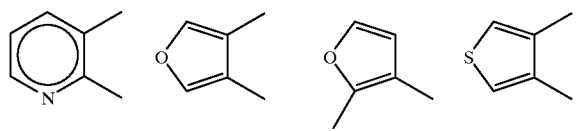

or

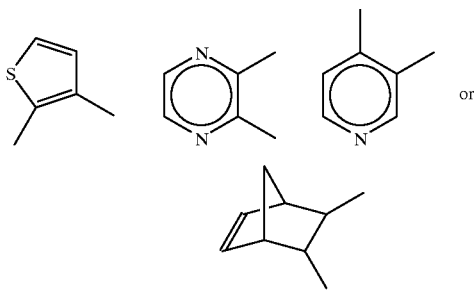

wherein $R^6$, $R^7$, $R^8$ and $R^9$ each are independently selected from hydrogen and $C_1$-$C_4$ alkyl $R^2$ is preferably hydrogen, $C_1$-$C_4$ alkyl or phenyl.

In a particular preferred embodiment of the present invention $R^1$ is $C_1$-$C_3$ alkyl or carboxyphenyl.

Unit C may be present several times in a polymer molecule with different groups $R^1$.

Still a further essential unit of the polyvinyl acetal copolymer of the present invention is unit (D)

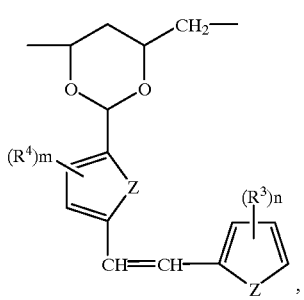
(D)

wherein
each Z is independently selected from the group consisting of O, S and $NR^5$ with $R^5$ being selected from the group consisting of hydrogen, $C_1$-$C_4$ alkyl and phenyl, the phenyl being optionally substituted with one or two substituents selected from the group consisting of halogen, $C_1$-$C_4$ alkoxy and $C_1$-$C_4$ alkyl;
$R^3$ and $R^4$ are independently selected from $C_1$-$C_4$ alkyl and a phenyl group, the phenyl being optionally substituted with one or two substituents selected from the group consisting of halogen, $C_1$-$C_4$ alkoxy and $C_1$-$C_4$ alkyl; m is 0, 1 or 2 and n is 0, 1, 2 or 3,
and this unit (D) may be contained several times with various moieties Z, $R^3$ and $R^4$ independent of one another.

Unit (D) is present in the copolymer in an amount of about 5 to about 45 wt.-%, preferably about 10 to about 40 wt.-%, more preferred about 20 to about 30 wt.-%.

$R^4$ is preferably methyl or ethyl.

$R^3$ is preferably $C_{1-4}$ alkyl or phenyl, more preferred methyl, ethyl or phenyl.

Z is preferably O or S; especially preferred Z are either both O or both S.

An especially preferred unit D (hereinafter referred to as unit D') is represented by the following formula (D')

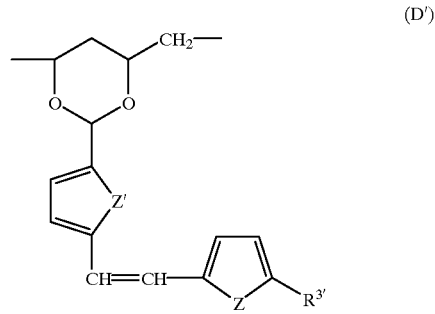
(D')

wherein $R^{3'}$ is $C_1$-$C_4$ alkyl, preferably methyl and Z' are either both O or both S.

Unit D may be present several times in a polymer molecule with different moieties Z, $R^3$ and $R^4$ independent of one another.

The vinyl alcohol/vinyl acetate copolymers that serve as starting material for the preparation of the polymers of the present invention are about 70 to 98 mole % hydrolyzed and have a weight-average molecular mass $M_W$ of about 20,000 to 150,000 g/mole. Suitable copolymers of this type are commercially available. Which copolymer is used as starting material for the synthesis depends on the intended use of the photosensitive composition. If lithographic plates are to be produced, polymers with a weight-average molecular mass $M_W$ of about 35,000 to 130,000 g/mole and an hydrolysis degree of the vinyl acetate structural unit of about 80 to 98 mole % are preferably used.

The polyvinyl acetal copolymers of the present invention can be prepared by simultaneously reacting one or more aldehydes corresponding to the desired unit(s) C and one or more vinylene furfural and/or vinylene thiophen aldehyde and/or vinylene pyrrol aldehyde corresponding to the desired unit(s) D with a polyvinylalcohol. It is also possible to first contact the polyvinyl alcohol with the furfural(s), thiophen aldehyde(s), pyrrol aldehyde(s) and then allow the product obtained to react with the aldehyd(s) corresponding to unit(s) C in a subsequent process step. The preferred aliphatic aldehydes for the acetalization of the vinyl alcohol/vinyl acetate copolymers are acetaldehyde, propionaldehyde or butyraldehyde. Particularly preferred is propionaldehyde. In general, developability and photochemical sensitivity of a photosensitive composition having the polymeric binders of the present invention will decrease as the amount of aliphatic aldehydes increases. 4-Formyl benzoic acid is the preferred aromatic aldehyde. The portion of incorporation of this compound should be balanced in such way that an acid number of the polymeric binder between 40 and 60 mg KOH/g results.

The reaction may take place in an organic solvent for vinyl alcohol/vinyl acetate copolymers (cf. Brochure Mowiol R-Polyvinyl alcohol, Hoechst AG, 1991 page C13), particularly preferred is dimethyl sulfoxide. The polyvinyl acetal copolymers of the present invention are, however, preferably prepared under mild conditions, i.e. room temperature or slightly elevated temperature, in the presence of an acid, preferably an organic acid like 4-toluene sulfonic acid. The end products are precipitated by stirring them into water. Then, the precipitated reaction product is separated, washed with water and dried by using hot air of 45 to 50° C. until the water content is reduced to no more than 4 wt.-%.

The lithographic plate precursors obtained by using the polyvinyl acetals of the present invention require neither an overcoating nor is a pre-heat step necessary. The lithographic plate precursors and plates, respectively, are marked by a good thermal stability, good developability and good resolution as well as good ink receptivity. Furthermore, the photosensitive compositions of this invention have the advantage that they are composed of very few components and are thus more economical.

The polyvinyl acetals of the present invention can be used as such as a radiation-sensitive coating on an optionally pretreated substrate of a printing plate precursor or they can be used in admixture with further components such as dyes/pigments for improving the contrast, surfactants, plasticizers and diazonium polycondensation products. Since the polyvinyl acetals of the present invention are capable of absorbing radiation in the range of 340 to 420 nm (i.e. radiation of a UV radiation source commonly used for imagewise exposing lithographic printing plates) no sensitizer is necessary in the coating. This is a great advantage at least from an economical point of view, since the sensitizers usually used are expensive. With the polyvinyl acetals of the present invention, printing plates can be obtained which are not only less expensive than those known in the art, but they also have a high print run stability, as well as high sensitivity and storage stability.

Suitable dyes and/or pigments which can be present in the radiation-sensitive compositions according to the present invention as optional components are those that do not show substantial absorption in the long-wavelength absorption range of the copolymers of the present invention; furthermore, they should dissolve well in the solvent or solvent mixture used for coating or are easily introduced as a pigment in the disperse form. Suitable dyes and/or pigments for increasing the contrast of the image include inter alia rhodamin dyes, methyl violet, anthraquinone pigments and phthalocyanine dyes and/or pigments. The dyes and/or pigments are preferably present in the radiation-sensitive composition in an amount of about 1 to 15 wt.-%, preferably about 2 to 7 wt.-%.

Suitable plasticizers include dibutyl phthalate, triaryl phosphate and dioctyl phthalate. Dioctyl phthalate is especially preferred. The amount of the plasticizer used is not limited but preferably about 0.25 to about 2 wt.-%.

The diazo polycondensation products which may be present in the radiation-sensitive compositions of the present invention are commonly known in the art and are the diazonium polycondensation products selected from those, which are soluble in organic solvents; these diazonium polycondensation products are well-known to those skilled in the art, and are described for instance in U.S. Pat. No. 4,687,727. It has been found by the inventors that depending on the pretreatment of the substrate, the properties of the printing plate precursor comprising a radiation-sensitive layer containing the polyvinyl acetals of the present invention can sometimes be firther improved if diazo polycondensation products are present in the radiation-sensitive layer. The additional use of diazo polycondensation products is especially preferred if the substrate used is aluminum anodized with sulfuric acid.

The diazonium polycondensation products useful in the present invention have been used hitherto for negative-working radiation sensitive lithographic printing plates. They are obtained by a condensation reaction of diazo monomers with aldehydes and precipitation of the reaction product with a certain anion. The condensation product is prepared by condensing a diazo monomer such as 4-diazo-diphenylamine, 1-diazo-4-N,N-dimethylaminobenzene, 1-diazo-4-N,N-diethylamino-benzene, 1-diazo-4-N-ethyl-N-hydroxyethylaminobenzene, 1-diazo-4-N-methyl-N-hydroxyethylamino-benzene, 1-diazo-2,5-diethoxy-4-benzoylaminobenzene, 1-diazo-4-N-benzylamino-benzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethyl-aminobenzene, 4-diazodimethylaniline, 1-diazo-2,5-dibutoxy-4-morpholinobenzene, 1-diazo-2,5-diethoxy-4-morpholinobenzene, 1-diazo-2,5dimethoxy-4-morpholino-benzene, 1-diazo-2,5-diethoxy-4-morpholinobenzene, 1-diazo-2,5-diethoxy-4-(4'-tolylmercapto)benzene, 1-diazo-3-ethoxy-4-N-methyl-N-benzylaminobenzene, 1-diazo-3-chloro-4-N,N-diethylaminobenzene, 1-diazo-3-methyl4-pyrrolidinobenzene, 1-diazo-2-chloro-4-N,N-dimethylamino-5-methoxy-benzene, 1-diazo-3-methoxy-4-pyrrolidinobenzene, 3-methoxy-4-diazodiphenyl-amine, 3-ethoxy-4-diazodiphenyl-amine, 3-(n-propoxy)-4-diazodiphenylamine or 3-(isopropoxy)-4-diazodiphenylamine with a condensing agent such as formaldehyde, acetaldehyde, propionaldehyde, butyric aldehyde, isobutyric aldehyde, benzaldehyde or aldehydes containing one or more carboxylic groups as described in U.S. Pat. No. 5,112,743, preferably in a molar ratio of 1:1 to 1:0.5, more preferably 1:1 to 1:0.8, by a conventional process, followed by precipitation with a suitable anion.

Diazonium polycondensation products soluble in organic solvents are for instance obtained by selecting tetrafluoroboric acid, hexafluorophosphoric acid, hexafluoroantimonic acid, hexafluoroarsenic acid, triisopropylnaphthalenesulfonic acid, 4,4'-biphenyldisulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoyl-benzenesulfonic acid or 4-toluenesulfonic acid, etc. as anion source. Among these, 4-toluenesulfonic acid and 2-methoxy-4-hydroxy-5-benzoylbenzene-sulfonic acid are particularly preferred.

Furthermore, mixed condensation products can be used which, apart from the diazonium salt units, comprise other non-photosensitive units, which are derived from condensable compounds, in particular from aromatic amines, phenols, phenol ethers, aromatic thioethers, aromatic hydrocarbons, aromatic heterocycles or organic acid amides.

Especially preferred examples of diazonium polycondensation products are reaction products of diphenylamine-4-diazonium salts, optionally having a methoxy group in the phenyl group bearing the diazo group, with formaldehyde or 4,4'-bis-methoxymethyl-diphenyl-ether, the latter being preferred. The most preferred diazonium polycondensation product is a polycondensation product of 3-methoxydiphenylamine-4-diazoniumsulfate and 4,4'-bis-methoxymethyl-diphenyl-ether, preferably precipitated as mesitylenesulfonate.

The diazonium polycondensation product is preferably present in the radiation-sensitive compositions of the present invention in an amount of from 0 to about 60 wt.-% based on the total weight of the composition, more preferably from 0 to about 30 wt.-% and most preferably from about 0 to about 20 wt.-%.

The photosensitive compositions of the present invention are preferably usable for producing lithographic printing plate precursors. In addition, however, they may be used in recording materials for creating images on suitable carriers and receiving sheets, for creating reliefs that may serve as printing molds, screens and the like, as light-hardening varnishes for surface protection and for the formulation of UV-hardening printing inks.

The radiation-sensitive composition according to the present invention is applied to the substrate in the form of a solution prepared by dissolving the components in a solvent capable of dissolving them. Preferred examples of the solvent include cyclohexanone, cyclopentanone, 2-heptanone, g-butyrolactone, methyl ethyl ketone, ethylene glycol monomethyl ether, ethylene glycol monoethyl ether, 2-methoxyethyl acetate, propylene glycol monomethyl ether, propylene glycol monomethyl ether acetate, methanol, acetone, tetrahydrofuran, methyl lactate and ethyl lactate. These solvents may be used singly or in admixture.

One or more surfactants may be added to the solvent. Specific examples of the surfactant include nonionic surfactants such as polyoxyethylene alkyl ethers, polyoxyethylene-polyoxypropylene block copolymers, fluorine surfactants, organosiloxane polymers and acrylic or methacrylic (co)polymers, which are known for those skilled in the art. The amount of the surfactant(s) to be incorporated is usually in the range of about 2 parts by weight or less, preferably about 1 part by weight or less, based on 100 parts by weight of solid content of the composition according to the present invention.

For the preparation of lithographic printing plate precursors the radiation-sensitive composition is coated on a dimensionally stable substrate. Examples of such a support include paper, paper on which plastic (e.g. polyethylene, propylene, polystyrene) is laminated, a thin plate of metal such as aluminium (including aluminium alloys), zinc, copper, etc., a film of plastic (cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate, polyvinyl acetal), and a paper or plastic on which the metal as cited above is laminated. Of these supports, an aluminium plate is preferred over the others since it has markedly high dimensional stability and especially high adhesiveness to the radiation-sensitive layers using the present radiation-sensitive compositions, and is inexpensive. Also, a composite sheet formed by laminating an aluminium sheet on a polymeric film can be used.

When a metal substrate, especially an aluminium plate is used, it is preferred that the substrate undergoes a surface treatment such as a graining treatment like brush graining and electrolytic graining, an anodic oxidation treatment, etc; the details of such a treatment are commonly known in the art. In a further preferred embodiment, the support is then treated with a silicate (sodium or potassium silicate) as disclosed in U.S. Pat. No. 2,714,066, potassium fluorozirconate as disclosed in U.S. Pat. No. 2,946,638, a phosphate, a phosphate/fluoride composition or an organic compound selected from the group consisting of carboxymethyl cellulose, dextrin, gum arabic, amino group-containing phosphonic acids, organic phosphonic acids including polyvinyl phosphonic acid, organic phosphates, amino acids, and hydroxyl group-containing amine hydrochlorides, etc. These compounds may be used singly or as a mixture of two or more thereof. The details of such a hydrophilizing treatment are well-known to the person skilled in the art.

The compositions of the present invention may be applied to the support as formulations containing up to about 20% total solids by coating methods well known in the art. For example, slot coating, gravure coating, air knife coating, dip coating spray coating, and other methods may be used with satisfactory results. The coatings are preferably dried at temperatures up to about 120° C. to give dry coating weights preferably in the range of about 0.5 to about 4 g/m$^2$, particularly preferred from about 0.8 to about 2 g/m$^2$.

Although not an essential requirement, in few cases, the additional application of an oxygen-impermeable, water-soluble overcoating on a photosensitive layer may be advantageous. The polymers suitable for the top layer include polyvinyl alcohol, polyvinyl alcohol/polyvinyl acetate copolymers, polyvinyl pyrrolidone, polyvinyl pyrrolidone/polyvinyl acetate copolymers and gelatine. The layer weight of the oxygen-impermeable top layer is preferably about 0.1 to 4 g/m$^2$, and more preferably about 0.3 to 2 g/m$^2$. The overcoat may contain also organic or inorganic particles. However, the lithographic plate precursors produced using the photosensitive compositions of the present invention do have excellent properties even without top layer.

The thus obtained lithographic plate precursors are exposed to UV radiation with a commonly used radiation source such as metal halide doped mercury lamps and developed with an alkaline developer commonly used for negative working printing plates as known to the person skilled in the art. The developed plates are usually treated with a preservative ("rubber coating"). The preservatives are aqueous solutions of hydrophilic polymers, wetting agents and other additives.

For certain uses it is furthermore advantageous to increase the mechanical strength of the printing layers by means of a heat treatment or a combined use of heat and UV radiation. For this purpose, the plate is first treated with a solution that protects the non-image areas such that the heat treatment will cause no ink receptivity in these areas. A suitable solution is described e.g. in U.S. Pat. No. 4,355,096. However, the lithographic plates produced using the photosensitive compositions of the present invention do have excellent properties even with no heat treatment.

The following examples serve to provide a more detailed explanation of the invention, but they should not be construed as to limit this invention.

EXAMPLES

Reference Example 1

Synthesis of 5-[2-(5-methylfuryl vinylene)]furfural (hereinafter referred to as FVF)

In a three neck flask provided with magnetic stirring, 20 ml of 5-methyl furfural and 1.2 g of NaOH were added to 50 ml of a solution made up with 2 parts of water and 1 part of methyl alcohol (in volume). The solution was brought to boiling point, flashed with nitrogen and maintained 1.5 hours under reflux. Then the mixture was neutralized with acetic acid, shaken with water and methylene chloride to extract the organic part. This organic phase was dried over anhydrous sodium sulphate, filtered and concentrated by vacuum evaporation.

The FVF was isolated by distillation under high vacuum (10–5 mm Hg) or by chromatography on silica gel (hexanelethyl acetate 90:10 as eluent). It could be purified by a second distillation or by crystallisation in methyl alcohol. It was obtained as a yellow crystalline powder. The yield was approximately 40%.

Reference Example 2

Synthesis of 5-[2-(5-methylthienylvinylene)]thiophene aldehyde (hereinafter referred to as TVT)

In a three neck flask provided with magnetic stirring, 20 ml of 5-methyl thiophene 2-aldehyde and 1.2 g of NaOH were added to 50 ml of a solution made up with 2 parts of water and 1 part of methyl alcohol (in volume). The solution was brought to boiling point, flashed with nitrogen and maintained 4 hours under reflux. Then the mixture was neutralised with acetic acid, shaken with water and methylene chloride to extract the organic part. This organic phase was dried over anhydrous sodium sulphate, filtered and concentrated by vacuum evaporation.

The TVT was isolated by distillation under high vacuum (10–5 mm Hg) or by chromatography on silica gel (hexane/ethyl acetate 90:10 as eluent). It could be purified by a second distillation or by crystallisation in methyl alcohol. It was obtained as a yellow crystalline powder. The yield was approximately 45% and the melting point was determined to be 114° C.

Example 1

Polyvinylacetal 1 (FVF 10 mol %, propionaldehyde 30 mol %)

Method 1

20 g Mowiol 8-88 (available from Clariant, Mw. 67000, 12% residual acetate groups) were dissolved in 200 ml of dimethylsulfoxide (DMSO) with magnetic stirring. 3.12 g of propionaldehyde and 3.6 g of 5-[2-(5-methylfuryl vinylene)] furfural (FVF) were added. The reaction was acid catalysed by 2 g of para-toluene sulfonic acid (pTS). The mixture was stirred in the dark, at room temperature, for 24 hours. Then the solution was neutralised with 1.44 ml of triethylamine. The polymer was isolated by precipitation in an excess of water, filtered and dried in a vacuum oven at 50° C. for two days.

Method 2

This polymer could also be obtained by the following procedure: in the first reaction step, only the FVF was grafted, the polymer was isolated by precipitation in water and then dissolved again in DMSO for the reaction with the propionaldehyde.

In both cases, according to the analysis by $^1$H-NMR in DMSO-$d_6$, the polymer contained between 8 and 10 mol % of FVF acetal units and 30 mol % of propionic acetal units.

Example 2

Polyvinylacetal 2 (FVF 20 mol %, propionaldehyde 30 mol %)

20 g of Mowiol 8-88 were dissolved in 200 ml of DMSO with magnetic stirring. 2 g of pTS were used as catalyst. 7.3 g of FVF and 3.12 g of propionaldehyde were added. The reaction mixture was stirred for 24 hours in the dark, at room temperature. The solution was neutralised by 1.44 ml of triethylamine. The polymer was precipitated in an excess of water, filtered and dried in a vacuum oven at 50° C. for two days.

According to $^1$H-NMR analysis in DMSO-$d_6$ the polymer contained 16 and 20 mol % of FVF acetal units and 30 mol % of propionic acetal units.

Example 3

Polyvinylacetal 3 (FVF 20 mol %, propionaldehyde 30 mol %, 4-formylbenzoic acid 20 mol %)

20 g of Mowiol 8-88 were dissolved in 200 ml of DMSO with magnetic stirring. 2 g of pTS were used as catalyst. 3.12 g of propionaldehyde, 7.3 g of FVF and 5.5 g of 4-formylbenzoic acid were added. The reaction mixture was stirred for 24 hours in the dark, at room temperature. The solution was neutralized with 1.44 ml of triethylamine. The polymer was precipitated two times in an excess of water to remove the DMSO. It was then filtered and dried at 50° C. for two days.

Titration with a 0.1 N of KOH solution gave an acid number of 44 mg of KOH/g.

Example 4

Polyvinylacetal 4 (TVT 20 mol %, propionaldehyde 30 mol %, 4-formylbenzoic acid 20 mol %)

21 g of Mowiol 8-88 were dissolved in 200 ml of DMSO with magnetic stirring. 2 g of pTS were used as catalyst. 3.29 g of propionaldehyde, 8.8 g of TVT and 5.78 g of 4-formylbenzoic acid were added. The reaction mixture was stirred for 24 hours in the dark, at room temperature. The solution was neutralized with 1.44 ml of triethylamine. The isolated polymer was treated two times in an excess of water to remove the DMSO. It was then filtered and dried at 50° C. for two days. After all these treatments 28.3 g polyvinylacetal 4 was received.

Titration with a 0.1 N KOH solution gave an acid number of 51 mg of KOH/g.

Example 5

Polyvinylacetal 5 (TVT 15 mol %, propionaldehyde 30 mol %)

21 g of Mowiol 8-88 were dissolved in 200 ml of DMSO with magnetic stirring. 2 g of pTS were used as catalyst. 6.63 g of TVT and 3.29 g of propionaldehyde were added. The reaction mixture was stirred for 24 hours in the dark, at room temperature. The solution was neutralised by 1.44 ml of triethylamine. The polymer was precipitated in an excess of water, filtered and dried in an vacuum oven at 50° C. for two days. 29.4 g of polyvinylacetal 5 were isolated.

According to $^1$H-NMR in DMSO-$d_6$ the obtained polymer contains about 15 mol % of TVT acetal units and about 30 mol % of propionic acetal units.

Example 6
Radiation-sensitive Composition and Printing Plate 1.66 g of polyvinylacetal 1 obtained in Example 1 and 0.2 g of Renol blue B2G-HW® (Clariant; copper phthalocyanine pigment dispersed in polyvinyl butyral) were dissolved under stirring in 40 ml of a solution consisting of:

45 parts by volume of methyl alcohol (MeOH)
30 parts by volume of methyl glycol (MC)
25 parts by volume of methyl ethyl ketone (MEK)

After being filtered, the solution was applied to an electrochemically grained aluminium foil which had been anodised in a solution of $H_3PO_4$ and then posttreated with polyvinylphosphonic acid (PVPA) (1.4 g in 1 l water, room temperature, 50 s dwell time). The plate was dried for 4 min at 90° C. The dry weight of the printing layer amounted to approximately 1 g/m².

The plate was exposed under a silver halftone film (Ugra grey scale) with an exposure energy of 100 mJ/cm². The exposed plate was treated with an alkaline developer for negative working plates 952 (Kodak Polychrome Graphics) for 30 s then rubbed with a tamp for 30 s. After this treatment, the exposed portions remain on the plate.

The plate ink receptivity was good and exposed micro lines are well reproduced. The gray wedge is completely covered (in the following referred as solids) up to step 3 and partially covered (in the following referred as tail) up to step 7. Micro lines are produced up to step 4, while gaps are reproduced up to step 15.

For the preparation of a lithographic plate, a printing layer was applied to the aluminum foil, as explained above, exposed, developed and after rinsing with water, the developed plate was wiped and rubbed with an aqueous solution of 0.5% phosphoric acid and 6% gum arabic. The thus prepared plate was loaded in a sheet-fed offset printing machine and under normal printing conditions provided 90.000 copies of good quality.

To simulate aging of the plate, it was stored for 10 days at a temperature of 40° C. and 80% relative humidity. The thus treated plates were used for printing in a sheet-fed offset printing machine and exhibited no change in their printing behaviour (especially the print run stability) in comparison to the plate that was not artifically aged.

Example 7
Radiation-sensitive Composition and Printing Plate

A solution for a radiation-sensitive layer was prepared from the following components:

1.66 g of polyvinylacetal 1 obtained in Example 1
0.08 g of a polycondensation product of 1 mole 3-methoxydiphenylamin-4-diazonium sulfate and 1 mole 4,4'-bis-methoxy-methyldiphenylether, precipitated as mesitylenesulfonate
0.2 g of Renol blue B2G-HW® (Clariant; copper phthalocyanine pigment dispersed in polyvinyl butyral)

These components were dissolved under stirring in a solution consisting of 45 parts in volume of methyl alcohol (MeOH)
30 parts in volume of methyl glycol (MC)
25 parts in volume of methyl ethyl ketone (MEK)

After being filtered, the solution was coated on an electrocally grained aluminium foil anodised in a solution of $H_2SO_4$ and sealed with PVPA. The plate was dried for 4 min at 90° C., then exposed under the Ugra gray scale with an exposure power of 150 mJ/cm². The plate was treated for 25 s with alkaline developer 952 for negative working plates and then rubbed with a tamp.

Copy results: solids up to 3, tail up to 6, lines up to 6/8, gaps up to 12.

In the sheet-fed offset printing machine and under normal printing conditions, one lithographic plate provided 110.000 copies of good quality.

Example 8
Radiation-sensitive Composition and Printing Plate

A solution for a photosensitive layer was prepared from the following components:

1.66 g of polyvinylacetal 2 obtained in Example 2
0.08 g of a polycondensation product of 1 mole diphenylamin-4-diazonium sulfate and 1 mole formaldehyde, precipitated as tosylate
0.2 g of Renol blue B2G-HW® (Clariant; copper phtalocyanine pigment dispersed in polyvinyl butyral)

These components were dissolved under stirring in a solution consisting of 45 parts in volume of methyl alcohol (MeOH)
30 parts in volume of methyl glycol (MC)
25 parts in volume of methyl ethyl ketone (MEK)

After being filtered, the solution was coated on a substrate which was pretreated as described in Example 7. The plate was dried for 4 min at 90° C., then exposed under an Ugra gray scale with an energy power of 150 mJ/cm². The plate was treated with alkaline developer 952 for negative working plates for 25 s, then rubbed with a tamp for 25 s.

Copy results: solids up to 3, tail up to 7, lines up to 4, gaps up to 12.

Example 9
Radiation-sensitive Composition and Printing Plate

A solution for a photosensitive layer was prepared from the following components:

1.66 g of the polyvinylacetal 3 obtained in Example 3
0.08 g of a polycondensation product of 1 mole diphenylamin-4-diazonium sulfate and 1 mole formaldehyde, precipitated as tosylate
0.2 g of Renol blue B2G-HW® (Clariant; copper phtalocyanine pigment dispersed in polyvinyl butyral)

These components were dissolved under stirring in a solution made up with:

45 parts in volume of methyl glycol
30 parts in volume of methyl glycol
25 parts in volume of methyl ethyl ketone.

After being filtered, the solution was coated on an aluminum substrate. The plate was dried for 4 min at 90° C., then exposed under an Ugra gray scale with an exposure power of 230 mJ/cm². The plate was treated with alkaline developer 952 for negative working plates for 10 s, then rubbed with a tamp for 10 s.

Copy results: solid up to 3, tail up to 7, lines up to 6/8, gaps up to 10.

Example 10
Radiation-sensitive Composition and Printing Plate

Example 9 was repeated, but instead of polvyvinylacetal 3 polyvinylacetal 4 obtained in Example 4 was used and the exposure energy was 300 mJ/cm².

Copy results: solid up to 3, tail up to 7, lines up to 6/8, gaps up to 10.

No ink acceptance problems occurred.

Example 11
Radiation-sensitive composition and printing plate

Example 4 was repeated, but instead of polyvinylacetal 1 polyvinylacetal 5 obtained in Example 5 was used and processed.

Copy results: solids up to 3, tail up to 8, lines up to 4, gaps up to 12.

No ink acceptance problems occurred.

Comparative Example 1

A coating solution is prepared from the following components:
- 5.25 g of copolymer of methyl methacrylate/N-[2-(methacryloyloxy)ethyl]-2,3-dimethyl maleinimide/ methacrylic acid (weight ratio: 15/65/20)
- 0.3 g of Renol Blue B2G-HW® (Clariant; copper phthalocyanine pigment dispersed in polyvinyl butyral)
- 0.3 g of Quantacure ITX® (Rahn: isopropyl thioxanthone)

The mentioned components are dissolved in the solvent mixture according to Example 1 and further processed as described there. The weight of the printing layer amounts to approx. 1 g/m².

The printing layer is exposed, developed and blackened as described in Example 1. Upon blackening, the printing layer exhibits a solid step of 2 and the steps up to 7 are partially covered. In the sheet-fed offset printing machine, one lithographic plate provided only 5.000 copies of good quality.

We claim:

1. A polyvinyl acetal copolymer comprising at least one unit of A, at least one unit of B, at least one unit of C and at least one unit of D wherein A is present in an amount of about 0.5 to about 20 weight percent and has the formula

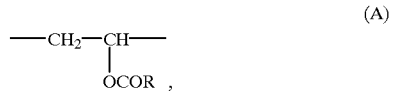

(A)

wherein R is hydrogen or $C_1$–$C_6$ alkyl;

B is present in an amount of about 10 to about 35 weight percent and has the formula

(B)

C is present in an amount of about 10 to 55 weight percent and has the formula

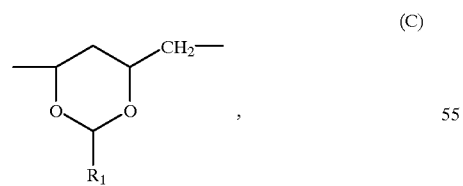

(C)

wherein $R^1$ is an unsubstituted alkyl groups with up to 4 carbons, an alkyl group with up to four carbons substituted by an acid group, a phenyl group to which an acid group is attached, a phenyl group to which an acid group is attached wherein the phenyl group comprises up to two further substituents selected from the group consisting of halogen, amino, methoxy, ethoxy, methyl and ethyl, or $R^1$ is a group X—NR²—CO— Y—COOH wherein X is an aliphatic, aromatic or an araliphatic spacer group, $R^2$ is hydrogen or an aliphatic, aromatic or araliphatic moiety and Y is a saturated or unsaturated acyclic or cyclic spacer group;

D is present in an amount of about 5 to about 45 weight percent and has the formula

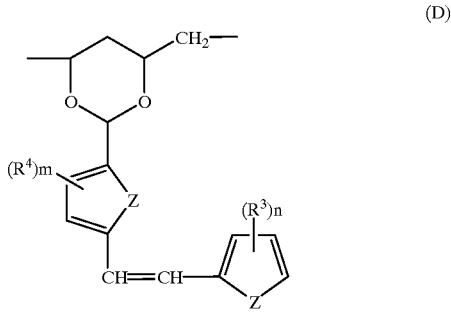

(D)

wherein each Z is independently selected from the group consisting of O, S and $NR^5$ wherein $R^5$ is selected from the group consisting of hydrogen, $C_1$–$C_4$ alkyl, phenyl and phenyl substituted with up to two substituents selected from the group consisting of halogen, $C_1$–$C_4$ alkoxy and $C_1$–$C_4$ alkyl, $R^3$ and $R^4$ are independently selected from the group consisting of $C_1$–$C_4$ alkyl, phenyl and phenyl substituted with up to two substitutents selected from the group consisting of halogen, $C_1$–$C_4$ alkoxy and $C_1$–$C_4$ alkyl, and wherein m is 0, 1 or 2 and n is 0, 1, 2 or 3 each A being the same or different, each C being the same or different and each D being the same or different.

2. A polyvinyl acetal copolymer according to claim 1, wherein R is selected from the group consisting of hydrogen and methyl.

3. A polyvinyl acetal copolymer according to claim 1, wherein $R^1$ is selected from the group consisting of $C_1$–$C_3$ alkyl and carboxyphenyl.

4. A polyvinyl acetal copolymer according to claim 1, wherein each Z is the same and selected from the group consisting of O and S and D has the formula

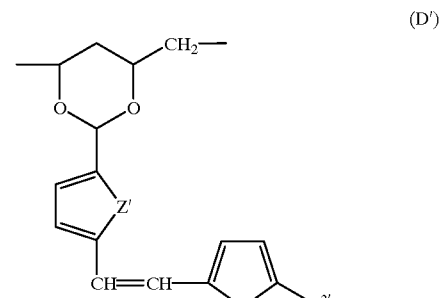

(D')

wherein $R^{3'}$ is $C_1$–$C_4$ alkyl.

5. A polyvinyl acetal copolymer according to claim 1, prepared by the process of simultaneously reacting at least one aldehyde which reacts to form unit C and at least one aldehyde including a unit selected from the group consisting of furylvinylidene unit, thienylvinylidene unit and pyrrolylvinylidene unit which reacts to form unit D with a polyvinyl alcohol having a weight average molecular weight of about 20,000 to 150,000 g/mole.

6. A radiation-sensitive composition comprising a polyvinyl acetal copolymer according claim 1 and at least one selected from the group consisting of dyes, pigments, surfactants, plasticizers and diazonium polycondensation products.

7. A radiation-sensitive composition according to claim 6 comprising at least one selected from the group consisting of a dye and a pigment.

8. A radiation-sensitive composition according to claim 7 further comprising a diazonium polycondensation product.

9. A lithographic printing plate precursor comprising a substrate and a radiation-sensitive layer comprising a polyvinyl acetal copolymer according to claim 1.

10. A lithographic printing plate precursor comprising a substrate and a radiation-sensitive layer comprising a polyvinyl acetal copolymer according to claim 4.

11. A lithographic printing plate precursor according to claim 9, wherein the radiation-sensitive layer further comprises at least one selected from the group consisting of a dye and pigment.

12. A lithographic printing plate precursor according to claim 10, wherein the radiation-sensitive layer further comprises at least one selected from the group consisting of a dye and a pigment.

13. A lithographic printing plate precursor according to claim 11, wherein the radiation-sensitive layer further comprises a diazonium polycondensation product.

14. A lithographic printing plate precursor according to claim 12, wherein the radiation-sensitive layer further comprises a diazonium polycondensation product.

15. A lithographic printing plate precursor according to claim 9, wherein the substrate is an aluminum foil.

16. A lithographic printing plate precursor according to claim 10, wherein the substrate is an aluminum foil.

17. A lithographic printing plate precursor according to claim 15, wherein the substrate is a pretreated substrate which has been grained and subsequently anodized with one selected from the group consisting of $H_3PO_4$ and $H_2SO_4$.

18. A lithographic printing plate precursor according to claim 16, wherein the substrate is a pretreated substrate which has been grained and subsequently anodized with one selected from the group consisting of $H_3PO_4$ and $H_2SO_4$.

19. A lithographic printing plate precursor according to claim 13, wherein the substrate is an aluminum foil which has been grained and subsequently anodized with $H_2SO_4$.

20. A lithographic printing plate precursor according to claim 14, wherein the substrate is an aluminum foil which has been grained and subsequently anodized with $H_2SO_4$.

21. A lithographic printing plate precursor according to claim 17, wherein the substrate has been sealed with polyvinylphosphonic acid after being anodized.

22. A lithographic printing plate precursor according to claim 18, wherein the substrate has been sealed with polyvinylphosphonic acid after being anodized.

23. Method for preparing a lithographic printing plate precursor, comprising (a) providing an aluminum substrate (b) graining the substrate (c) anodizing the substrate obtained in step (b) with one selected from the group consisting of $H_3PO_4$, and $H_2SO_4$; and (d) coating the substrate obtained in step (c) with a radiation-sensitive composition comprising a polyvinylacetal copolymer according to claim 4.

24. Method according to claim 23 wherein the radiation sensitive composition further comprises at least one selected from the group consisting of dyes, pigments, surfactants, plasticizers and diazonium polycondensation products.

25. Method according to claim 23 further comprising sealing the substrate obtained in step (c) with polyvinyl phosphonic acid prior to coating.

26. Method according to claim 24 further comprising sealing the substrate obtained in step (c) with polyvinyl phosphonic acid prior to coating.

27. Method for providing an image comprising:

(a) providing a printing plate precursor according to claim 9, (b) imagewise exposing the precursor to UV radiation, and (c) treating the exposed precursor with an alkaline developer for negative working printing plates.

28. Method for providing an image, comprising (a) providing a printing plate precursor according to claim 10, (b) imagewise exposing the precursor to UV-radiation, and (c) treating the exposed precursor with an alkaline developer for negative working printing plates.

29. Method for providing an image comprising:

(a) providing a lithographic printing plate precursor comprising an aluminum substrate which had been grained, subsequently anodized with one selected from the group consisting of $H_2SO_4$, and $H_3PO_4$ and thereafter sealed with polyvinylphosphonic acid, and a radiation-sensitive layer comprising a polyvinyl acetal copolymer according to claim 4, and at least one selected from the group consisting of a dye and a pigment, (b) imagewise exposing the precursor of step (a) to UV radiation (c) treating the exposed precursor with an alkaline developer for negative working printing plates.

30. Method according to claim 29 wherein the radiation-sensitive layer further comprises a diazonium polycondensation product.

* * * * *

UNITED STATES PATENT AND TRADEMARK OFFICE
CERTIFICATE OF CORRECTION

PATENT NO. : 6,270,938 B1
DATED : August 7, 2001
INVENTOR(S) : Gandini et al.

It is certified that error appears in the above-identified patent and that said Letters Patent is hereby corrected as shown below:

<u>Title page,</u>
Item [56], References Cited, U.S. PATENT DOCUMENTS, "3,732,105 5/1973 Colo" should read -- 3,732,105 5/1973 Klupfel et al. --

<u>Column 7,</u>
Line 14, "aldehyd(s)" should read -- aldehyde(s) --

<u>Column 8,</u>
Line 27, "firther" should read -- further --
Line 49, "1-diazo-2,5dimethoxy-4-morpholino-" should read -- 1-diazo-2,5-dimethoxy-4-morpholino- --
Line 50, "1-diazo-2,5-diethoxy-4-morpholinobenzene" should be deleted
Line 53, "1-diazo-3-methyl4-" should read -- 1-diazo-3-methyl-4- --

<u>Column 11,</u>
Line 28, "(hexanelethyl" should read -- (hexane/ethyl --

<u>Column 13,</u>
Line 6, "(MC)" should read -- (MG) --
Line 42, "artifically" should read -- artificially --
Line 50, "3-methoxydiphenylamin-4-diazonium" should read -- 3-methoxydiphenylamine-4-diazonium --
Line 59, "(MC)" should read -- (MG) --
Line 62, "trocally" should read -- trochemically --

<u>Column 14,</u>
Line 4, "110.000" should read -- 100,000 --
Line 13, "diphenylamin-4-diazonium" should read -- diphenylamine-4-diazonium --
Line 21, "(MC)" should read -- (MG) --
Line 38, "diphenylamin-4-diazonium" should read -- diphenylamine-4-diazonium --
Line 44, "methyl glycol" should read -- methyl alcohol --
Line 59, "polvyvinylacetal" should read -- polyvinylacetal --

UNITED STATES PATENT AND TRADEMARK OFFICE
CERTIFICATE OF CORRECTION

PATENT NO. : 6,270,938 B1
DATED : August 7, 2001
INVENTOR(S) : Gandini et al.

It is certified that error appears in the above-identified patent and that said Letters Patent is hereby corrected as shown below:

Column 15,
Line 26, "5.000" should read -- 5,000 --

Column 16,
Line 28, "substitutents" should read -- substituents --

Signed and Sealed this

Fourth Day of June, 2002

*Attest:*

*Attesting Officer*

JAMES E. ROGAN
*Director of the United States Patent and Trademark Office*